(12) United States Patent (10) Patent No.: US 9,413,381 B2
Vasani et al. (45) Date of Patent: Aug. 9, 2016

(54) HIGH-SPEED, LOW-POWER RECONFIGURABLE VOLTAGE-MODE DAC-DRIVER

(71) Applicant: BROADCOM CORPORATION, Irvine, CA (US)

(72) Inventors: Anand Jitendra Vasani, Irvine, CA (US); Ali Nazemi, Aliso Viejo, CA (US); Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/616,566

(22) Filed: Feb. 6, 2015

(65) Prior Publication Data

US 2016/0182080 A1 Jun. 23, 2016

Related U.S. Application Data

(60) Provisional application No. 62/093,359, filed on Dec. 17, 2014.

(51) Int. Cl.
| | |
|---|---|
| *H03M 1/66* | (2006.01) |
| *H03M 1/68* | (2006.01) |
| *H03M 1/00* | (2006.01) |
| *H03M 1/10* | (2006.01) |
| *H03M 1/74* | (2006.01) |

(52) U.S. Cl.
CPC ............... *H03M 1/68* (2013.01); *H03M 1/002* (2013.01); *H03M 1/1028* (2013.01); *H03M 1/74* (2013.01)

(58) Field of Classification Search
CPC ....................................... H03M 1/68

USPC ......... 341/144, 118, 120, 154, 122, 135, 152, 341/153, 145
See application file for complete search history.

(56) References Cited

U.S. PATENT DOCUMENTS

| | | | | | |
|---|---|---|---|---|---|
| 5,227,793 | A | * | 7/1993 | Aisu | H03M 1/068 341/136 |
| 5,703,588 | A | * | 12/1997 | Rivoir | H03M 1/0604 341/118 |
| 5,831,566 | A | * | 11/1998 | Ginetti | H03M 1/765 341/144 |
| 6,191,720 | B1 | * | 2/2001 | Zhang | H03M 1/682 341/144 |
| 6,275,179 | B1 | * | 8/2001 | Mori | H03M 1/068 341/144 |
| 6,476,746 | B2 | * | 11/2002 | Viswanathan | H04B 14/06 341/143 |
| 6,486,817 | B1 | * | 11/2002 | Okada | H03M 1/682 341/144 |
| 6,917,321 | B1 | * | 7/2005 | Haurie | H03M 1/804 341/144 |
| 9,154,154 | B2 | * | 10/2015 | Zele | H03M 1/70 |
| 2002/0158784 | A1 | * | 10/2002 | Panasik | H03M 3/50 341/144 |

* cited by examiner

*Primary Examiner* — Peguy Jean Pierre
(74) *Attorney, Agent, or Firm* — McDermott Will & Emery LLP

(57) ABSTRACT

A low-power reconfigurable voltage-mode digital-to-analog converter (DAC) driver circuit includes a first and a second supply voltage and a number of DAC units. Each DAC unit is coupled to a respective bit of a digital input. The DAC units are configured to maintain a constant output impedance. Each DAC unit includes one or more complementary switch pairs that couple first nodes of one or more respective impedances to one of the first or the second supply voltage, based on the respective bit of the digital input. Second nodes of the one or more respective impedances are coupled to an output node.

20 Claims, 11 Drawing Sheets

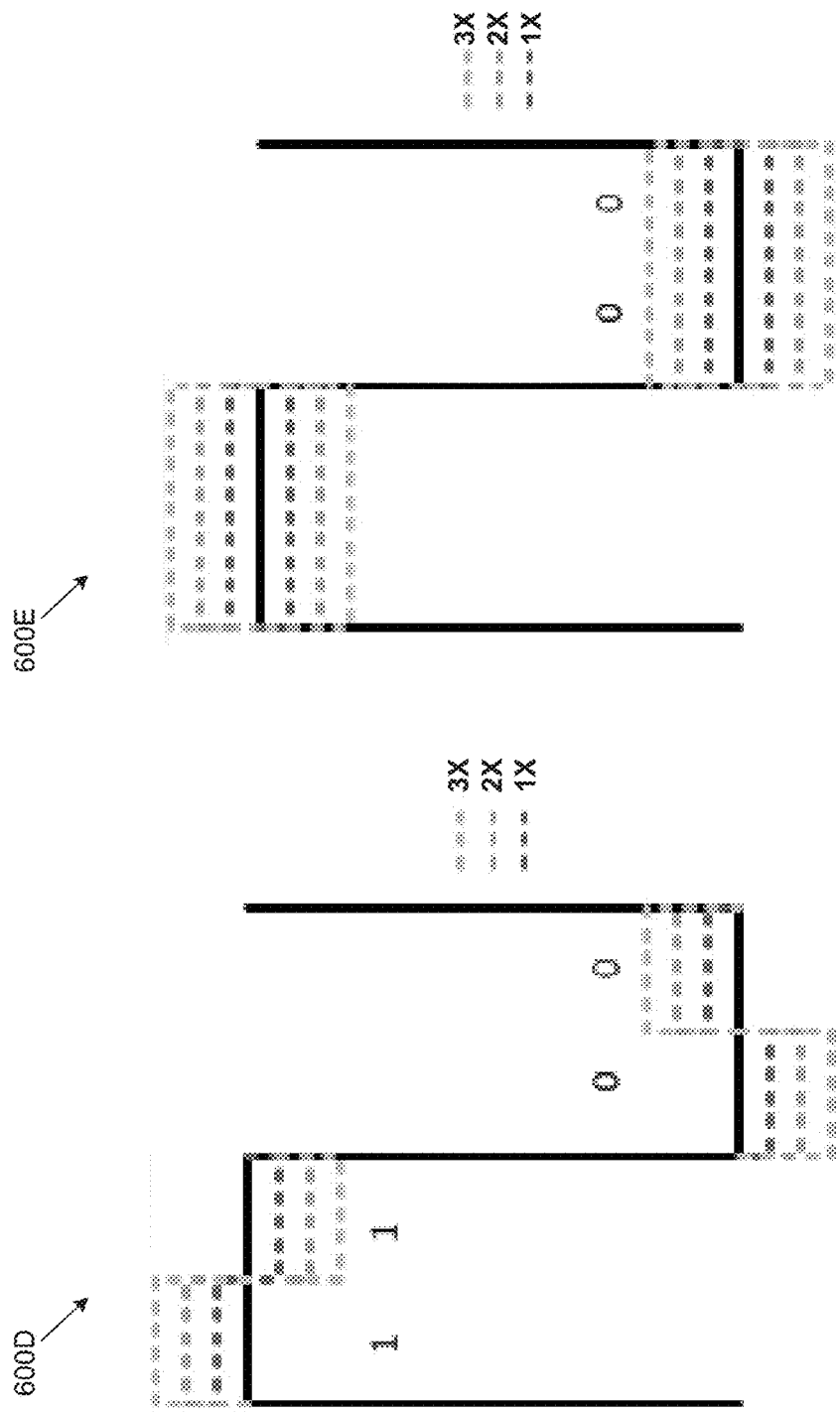

US 9,413,381 B2

HIGH-SPEED, LOW-POWER RECONFIGURABLE VOLTAGE-MODE DAC-DRIVER

CROSS-REFERENCE TO RELATED APPLICATIONS

This application claims the benefit of priority under 35 U.S.C. §119 from U.S. Provisional Patent Application 62/093,359 filed Dec. 17, 2014, which is incorporated herein by reference in its entirety.

TECHNICAL FIELD

The present description relates generally to digital-to-analog converter (DAC) circuits, and more particularly, but not exclusively, to a high-speed, low-power reconfigurable voltage-mode DAC-driver.

BACKGROUND

High-speed digital-to-analog converter (DAC) drivers are widely used in many optical and wired communication applications. For example, N-level pulse-amplitude modulation (PAM-N) signaling in high speed serdes and optical applications need high-speed low-power DAC and/or non-return-to-zero (NRZ) drivers. Existing DAC drivers such as current-mode DACs may be used at high speed but consume significant current and require substantial drive capability that make them high-power DAC drivers. For example, an existing n-bit current-mode DAC driver with a desired linearity needs a high supply-voltage (e.g., ~1.5V) and includes a number of (e.g., n) slices, each of which has to be driven by a level-shifter circuit to shift the voltage level of a respective input signal (e.g., a CMOS voltage level of ~0.9V) to a higher-voltage level (e.g., ~1.5V). The level-shifter circuit needs a high-supply voltage as well, which adds to the already high power consumption of the existing current-mode DAC driver.

BRIEF DESCRIPTION OF THE DRAWINGS

Certain features of the subject technology are set forth in the appended claims. However, for purpose of explanation, several embodiments of the subject technology are set forth in the following figures.

FIG. 6A through 6E illustrate an example of a low-power reconfigurable voltage-mode DAC driver circuit with an auxiliary DAC in accordance with one or more implementations.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In one or more aspects, methods and implementations for proving a high-speed, low-power reconfigurable voltage-mode DAC driver for N-level pulse-amplitude modulation (PAM-N) and optical transmitters are described. The voltage-mode DAC driver of the subject technology includes a number of advantageous features. At the circuit level, for example, the disclosed solution allows significantly lower (e.g., one third) power consumption, includes bandwidth extension techniques that enhances the performance, and is highly scalable both in terms of the number of bits and bandwidth. The system level advantages include low power and increased throughput efficiency, calibration and equalization capabilities that allows overcoming channel loss and non-linearity. Further, the switched-based architecture of the subject technology can take full advantage of process scaling. For example, in 20 nm and/or 16 nm technology nodes, the subject DAC architecture can be a desired choice for various data rates in the range of tens of GS/sec, depending on the number of DAC bits, for switch and/or serdes and optical applications.

Figure 1A:
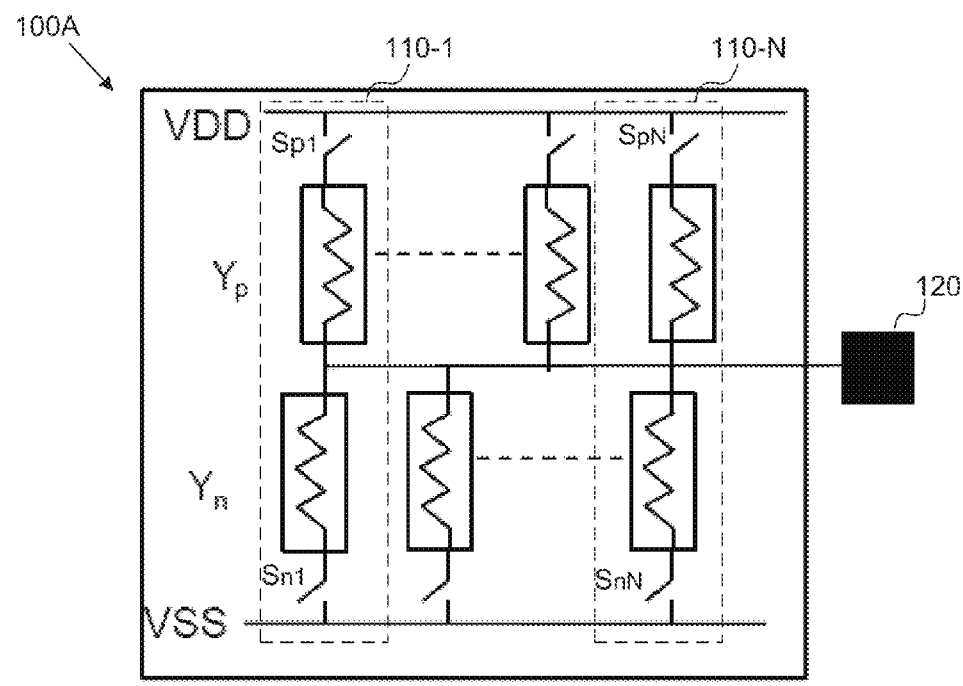
FIGS. 1A-1B are high-level diagrams illustrating examples of a low-power reconfigurable voltage-mode digital-to-analog converter (DAC) driver circuit in accordance with one or more implementations.
Figure 1B:
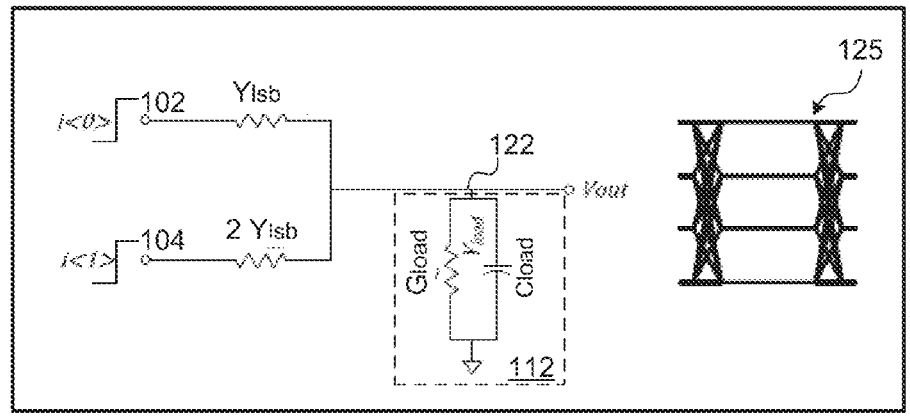

FIGS. 1A-1B are high-level diagrams illustrating examples 100A and 100B of a high-speed low-power reconfigurable voltage-mode digital-to-analog converter (DAC) driver circuit in accordance with one or more implementations of the subject technology. The example low-power reconfigurable voltage-mode DAC driver circuit (herein after "DAC driver circuit") 100A includes a first supply voltage $V_{DD}$ (e.g., 0.9V) and a second supply voltage $V_{SS}$ (e.g., 0V) and multiple (e.g., N) DAC units 110-1 ... 110-N. Each DAC unit (e.g., 110-1) is coupled to a respective bit of a digital input through a complementary switch pairs (e.g., $S_{p1}$ and $S_{n1}$). For example, the first bit of the digital input can close either the switch $S_{p1}$ or the switch $S_{n1}$, depending on the values of the digital input being a logical 1 ("1") or a logical zero ("0"). If the first bit of the digital input is "1", the output node 120 is coupled through $Y_p$ to $V_{DD}$. On the other hand, if the first bit of the digital input is "0", the output node 120 is coupled through $Y_n$ to VSS. Similarly, for other bits of the N-bit digital input, one of $Y_p$ or $Y_n$ couples the output node 120 to $V_{DD}$ or $V_{SS}$. The total admittance $Y_{total}$ at the output node 120 is formed by parallel combination of all conductances and is maintained constant, for example, at $\frac{1}{50}\Omega$.

$$Y_{total} = \Sigma Y_i = \Sigma Y_p + \Sigma Y_n = \frac{1}{50} \quad \text{(Eq. 1)}$$

Where $Y_p = Y_n$. Assuming $V_{SS} = 0$ (e.g., ground potential), the output voltage $V_{out}$ at the output node 120 can be expressed as:

$$V_{out} = \frac{\sum Y_p}{\sum Y_n + \sum Y_p} V_{DD} = 50\left(\sum Y_p\right) V_{DD} \quad \text{(Eq. 2)}$$

Equation 2 shows a linear relationship between the output voltage $V_{out}$ and the digital input, which decides the number of Yp connected to the $V_{DD}$ and $Y_n$ connected to the $V_{ss}$, with an output voltage step size of $50 V_{DD} Y_p$. The linear relationship is independent of frequency and holds at all operating frequencies. As explained above, the DAC units (e.g., 110-1 . . . 110-N) maintain a constant output impedance that is to match the load impedance (e.g., 50Ω) at all signal levels for signal integrity. Each DAC unit includes complementary switch pairs (e.g., $S_{p1}$ and $S_{n1}$) that can couple first nodes of the respective impedances (e.g. represented by the admittances $Y_p$ and $Y_n$) to one of the first or the second supply voltages $V_{DD}$ or $V_{SS}$ based on the respective bit of the digital input. Second nodes of the respective impedances are coupled to the output node 120 of the DAC driver circuit 100A. As discussed in further details herein, the complementary switch pairs can be implemented in CMOS, which results in substantial power saving.

An example simplified 2-bit binary weighted DAC driver circuit 100B is shown in FIG. 1B. It is understood that the disclosed DAC drivers, including the DAC driver circuit 100B, can be implemented for thermometer coding or other DAC mapping schemes. Using Eq. 2, a general formula for an $m_{th}$ level of the output voltage of an N-bit DAC can be written as:

$$V_{outm} = \frac{(mY_{lsb})}{((2^N - 1)Y_{lsb} + Y_{load})} V_{DD} \quad \text{(Eq. 3)}$$

Where m=0 to $(2^N - 1)$ and can dynamically change based on the incoming digital, data and $Y_{load}$ is the admittance of a load connected to the node 122. Eq. 3 can be reduced to:

$$V_{outm} = \frac{(mY_{lsb})}{(3Y_{lsb} + Y_{load})} V_{DD} \quad \text{(Eq. 4)}$$

For N=2 that, for example, represents the 2-bit DAC driver circuit 100B, for which the load 112 consists of the parallel connection of a resistor (e.g., $G_{load}$) and a capacitor (e.g., $C_{load}$). The expression in Eq. 4 can be understood by visualizing the 2-bit DAC driver circuit 100B as a voltage divider, for which the divider ratio can be dynamically switched based on the incoming data and allows a multilevel (e.g., 4-level) signaling eye, as shown by the $V_{out}$ signal 125. The output voltage, as shown in Eq. 3 (or Eq. 4 for the 2-bit case) is dependent on m, $Y_{lsb}$ and $Y_{load}$, and for the 2-bit DAC driver, m can vary from 0 to $(2^2 - 1) = 3$, therefore, generating four levels. It is worth mentioning that dependence of the output signal $V_{out}$ on $Y_{lsb}$, as explained above, is an interesting feature of the subject technology that can be used to make the DAC driver reconfigurable as explained herein.

To maintain the out impedance at 50Ω level, $Z_{lsb} = 1/Y_{lsb}$ has to be: $Z_{lsb} = 1/Y_{lsb} = (2^N - 1)50$, where N is the number of bits of the DAC driver and is equal to 2 for the 2-bit DAC driver circuit 100B. For example, for the 2-bit DAC driver circuit 100B, $Y_{lsb}$ has to be $\frac{1}{150}$ to maintain the output impedance of 50Ω, matching a 50Ω load. In some implementations, the $Y_{lsb}$ can be programmable. The 2-bit DAC driver circuit 100B can be used in a PAM-4 application. The concept explained above with respect to the 2-bit DAC driver circuit 100B can be readily extended to a multi-bit DAC or a PAM-N, and implemented in differential modes as described herein. For example, for a 4-bit DAC driver, the admittance of the third and fourth DACs would be $4Y_{lsb}$ and $8Y_{lsb}$. It is understood that using the same data for both inputs 102 and 104 can cause the 2-bit DAC driver circuit to function as a non-return-to zero (NRZ) driver. So, the 2-bit DAC driver circuit 100B is a reconfigurable DAC driver that can function both as 2-bit DAC driver or a NRZ driver.

FIGS. 2A through 2D illustrate example implementations of a low-power reconfigurable voltage-mode DAC driver circuit 200 in accordance with one or more implementations of the subject technology. The DAC driver circuit 200 shows an example single-ended implementation of the 2-bit DAC driver circuit 100B of FIG. 1B and includes two DAC units 220 and 230. The DAC units 220 and 230 correspond to a least significant (LSB) and most a significant bit (MSB) of the input digital signal, respectively. The LSB DAC unit 220 includes a number of (e.g., n) parallel-connected slices, 220-1 . . . 220-n, and the MSB DAC unit 230 includes twice the number of the slices of the LSB DAC unit 220, that is 2n slices, 230-1 . . . 230-2n. In general, for an N-bit DAC, the count of the DAC slices of a DAC unit that is coupled to an Nth significant bit of the digital input is equal to $(2^{N-1})n$, where n and N are positive integers.

Figure 2A:
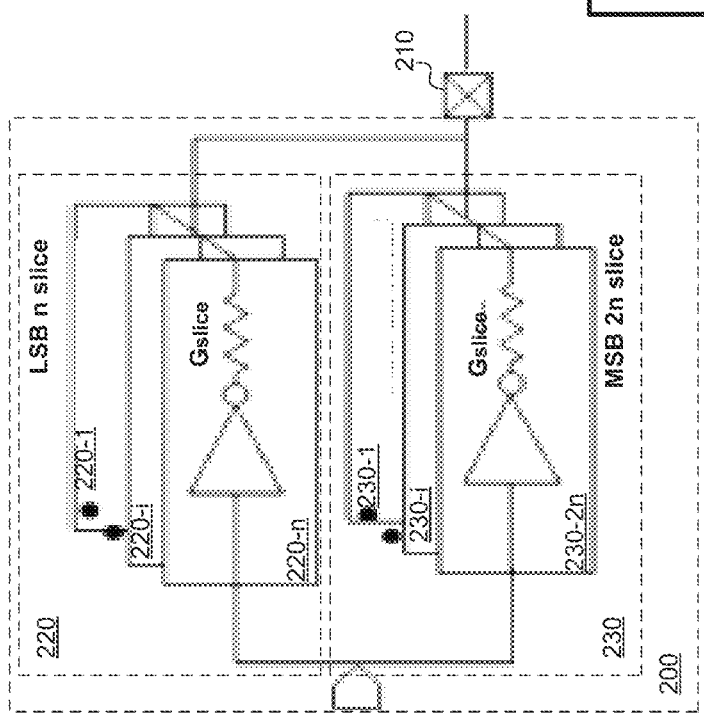
FIGS. 2A through 2D illustrate example implementations of a low-power reconfigurable voltage-mode 2-bit DAC driver circuit in accordance with one or more implementations.
Figure 2C:
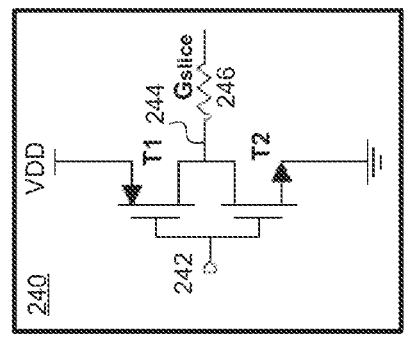
Figure 2B:
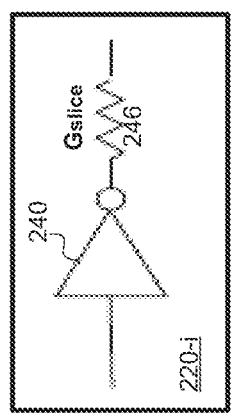

Each DAC slice (e.g., 220-i or 230-i), as shown in FIG. 2B, includes an inverter 240 and a series resistor 246 represented by a respective conductance $G_{slice}$, which when combined in parallel (e.g., 220-1 through 220-n) form the $G_{lsb}/Y_{lsb}$ of FIG. 1B. In one or more implementations, the inverter 240 that realizes pair of switches (e.g., $S_{p1}$ and $S_{n1}$) of FIG. 1A can be implemented, as shown in FIG. 2C, by using componentry transistors T1 and T2 of a CMOS inverter. The transistors (e.g., switches) T1 and T2 can connect a first node 244 of the series resistor 246 to either $V_{DD}$ or the ground potential based on the digital input data coupled to input node 242 of the inverter 240. The second node of the series resistor 246 is coupled to the output node 210 of the DAC circuit 220.

Figure 2D:
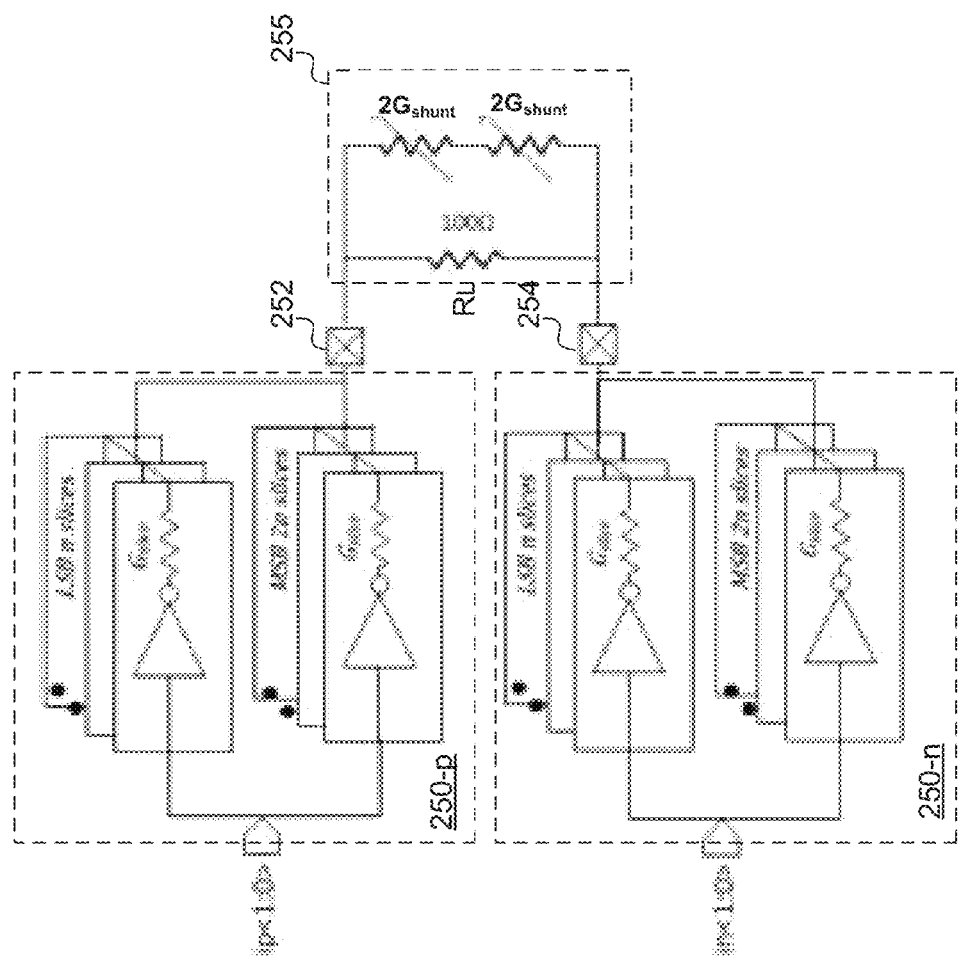

As discussed with respect to FIG. 1A, the output voltage signal at the output node 210 of the DAC driver circuit 220 is a linear function of the digital input that controls switches $S_{p1}$ through $S_{pN}$ a voltage of the first supply voltage $V_{DD}$ (see Eq. 1 and Eq. 2). In one or more implementations, the DAC driver circuit 220 can be implemented in a differential configuration as shown in FIG. 2D. The 2-bit DAC drivers 250-p and 250-n are similar to the DAC driver circuit 200 of FIG. 2A. The differential output nodes 252 and 254 are coupled to the load 255 that includes a parallel combination of the load impendance $R_L$ (e.g., 100Ω) and two variable resistors (e.g., each with a nominal conductance of $2G_{shunt}$). The variable resistors can be used to adjust the amplitude of the output voltage between the differential output nodes 252 and 254 in combination with the variable number of slices which constitute $Y_{lsb}$ by changing n. In order to maintain constant impedance, the single ended output voltage is modified in accordance with the following equation:

$$V_{outm} = \frac{(m \cdot n \cdot G_{slice} + G_L + G_{shunt})}{((2^N - 1) \cdot n \cdot G_{slice} + 2G_{shunt} + 2G_L)} V_{DD} \quad \text{(Eq. 5)}$$

Where m=0 to ($2^N$–1) and $G_L$ is the admittance of a load connected between 252 and 254. In a 2-bit DAC N=2 Eq. 5 can be reduced to:

$$V_{outm} = \frac{(m \cdot n \cdot G_{slice} + G_L + G_{shunt})}{(3 \cdot n \cdot G_{slice} + 2G_{shunt} + 2G_L)} V_{DD} \quad \text{(Eq. 6)}$$

As can be seen from Eq. 6, the output amplitude is made programmable by changing n and $G_{shunt}$ without affecting the linear relationship between the output and digital input, it also maintains the fixed impedance matching $G_L$ as long as ($2^N$–1)$nG_{slice}$+$2G_{shunt}$=$2G_L$.

Figures 3A, 3B:
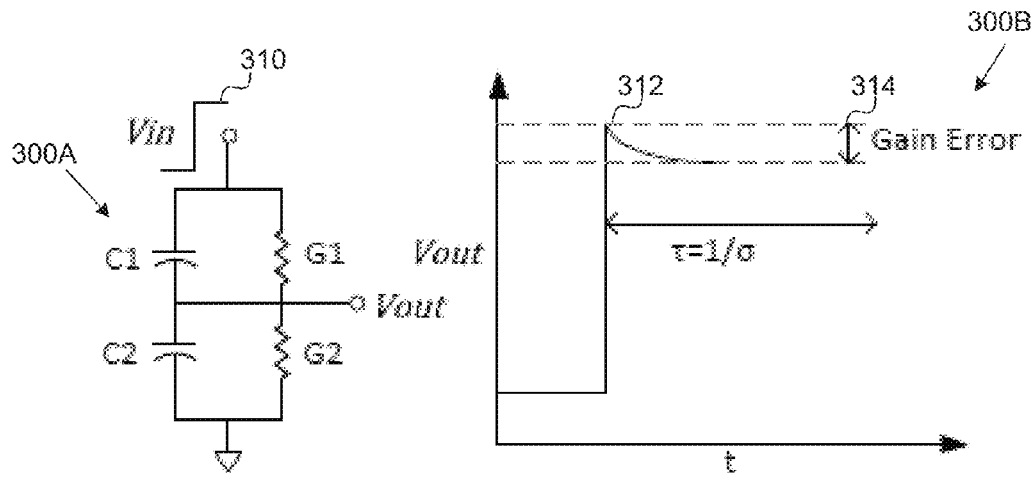
FIGS. 3A through 3C illustrate example schemes for increasing the bandwidth and high-frequency loss compensation of a low-power reconfigurable voltage-mode DAC driver circuit in accordance with one or more implementations.
Figure 3C:
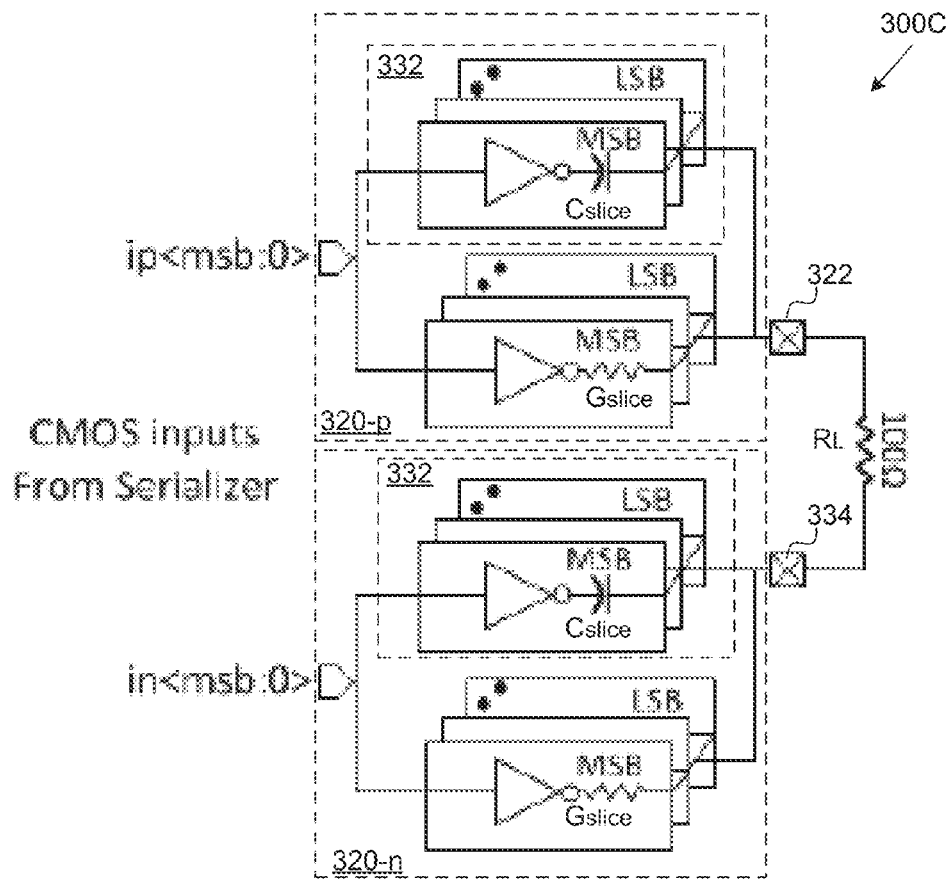

FIGS. 3A through 3C illustrate example schemes for increasing the bandwidth and high-frequency loss compensation of a low-power reconfigurable voltage-mode DAC driver circuit 300C in accordance with one or more implementations of the subject technology. In some aspects, the circuit includes equalization capacitors that can be used to extend a bandwidth of the circuit. The role of the equalization capacitors can be understood by examining the simple voltage divider 300A of FIG. 3A and the corresponding output signals 300B shown in FIG. 3B. The output signal of the divider 300A (when coupled to a capacitive load C2), without the capacitor C1 would be similar but slower than the input signal 310 (e.g., a step function). However, after modifying the divider circuit by the equalization capacitors C1, the response will change to the output signals 300B, which includes an overshoot 312 decaying with a time constant of τ=1/σ and resulting in a gain error 314. As seen, the equalization capacitors C1 causes the divider 300A to respond faster, that is to have a wider bandwidth, and under certain conditions, for example, G1/(G1+G2)=C1/(C1+C2), an optimum step response with no overshoot can be achieved. The equalization capacitors of the differential DAC driver 300C of FIG. 3C are implemented in capacitor DACs 332 of the positive and negative input DAC drivers 320-p and 320-n by capacitors represented by $C_{slice}$. The CMOS inputs of the differential DAC driver 300C can be provided by a serializer circuit, not shown for simplicity. Making the $C_{slice}$ programmable allows adjusting the amount of high frequency equalization possible. This can be achieved by changing the number of slices which can be programmed based on the application in order to get optimum results.

In some implementations, the equalization capacitors (e.g., $C_{slice}$) are implemented in the capacitive DAC units as shown in FIG. 3C or are embedded in the resistive DAC units, for example, in parallel with series resistors represented by $G_{slice}$. It is understood that value of the equalization capacitors need to scale between different bits similar to the series resistors to maintain linearity similar to the scaling of Glsb/Ylsb. An increase of the bandwidth and high-frequency loss compensation of the differential DAC driver 300C due to the use of compensation capacitors is substantial and can amount to approximately 30% or more, and is achieved without any significant increase in power consumption of differential DAC driver 300C. The equivalent impedance of the DAC drivers 320-p and 320-n has to match the impedance (e.g., 100Ω) of the load $R_L$ coupled between differential output nodes 332 and 334.

Figure 4A:
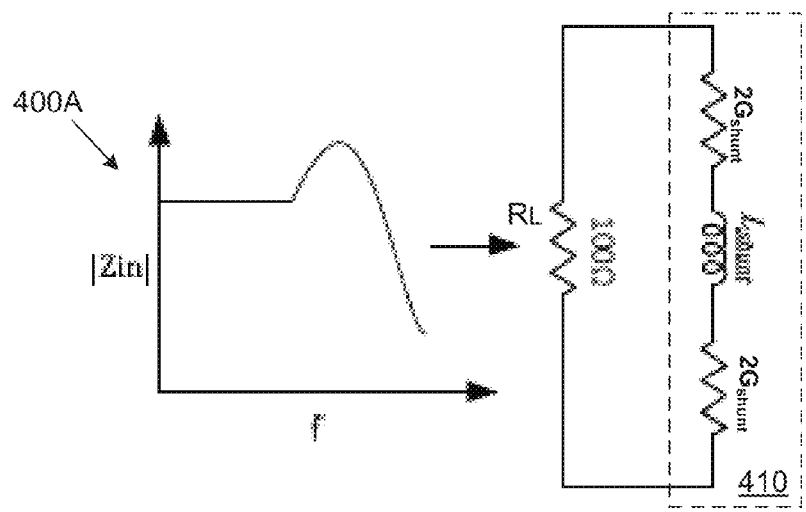
FIGS. 4A through 4C illustrate other example schemes for increasing the bandwidth of a low-power reconfigurable voltage-mode DAC driver circuit in accordance with one or more implementations.
Figure 4B:
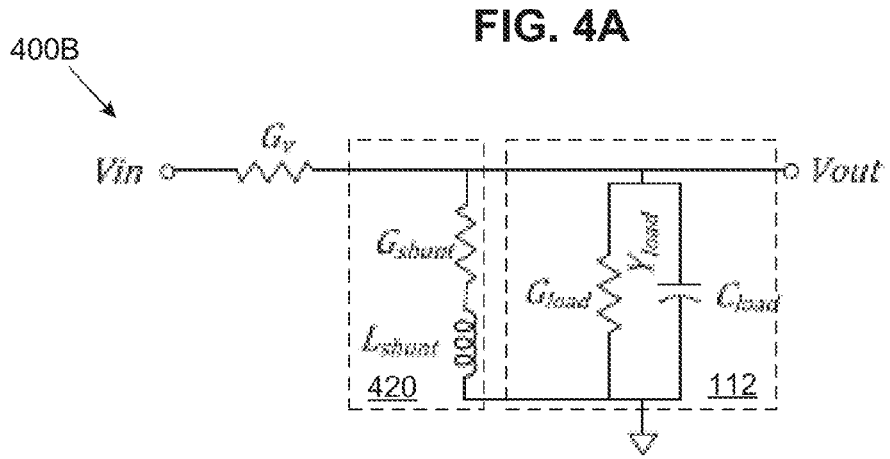
Figure 4C:
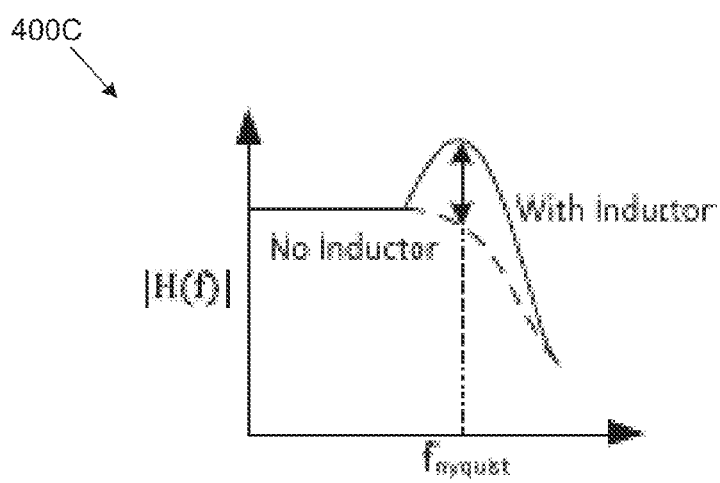

FIGS. 4A through 4C illustrate other example schemes for increasing the bandwidth of a low-power reconfigurable voltage-mode DAC driver circuit in accordance with one or more implementations of the subject technology. The bandwidth of the DAC driver circuit 200 of FIG. 2D can be improved by using shunt inductors that can frequency boost an amplitude of an output voltage of the circuit.

The shunt inductor is programmable and scalable with the number of bits of the digital input. The effect of a shunt inductor $L_{shunt}$ in a series combination 410 coupled in parallel with a load resistor $R_L$ (e.g., 100Ω) is shown in the frequency response 400A of FIG. 4A. The boost in the high frequencies of the response is due to the use of the shunt inductor $L_{shunt}$. The shunt inductor $L_{shunt}$ can be introduced as shown in the circuit 400B of FIG. 4B, which is otherwise similar to the circuit of FIG. 1B. The shunt branch 420 is coupled in parallel with the load 112 including the parallel combination of $G_{load}$ and $C_{load}$. The shunt branch 420 includes the shunt inductor $L_{shunt}$. The transfer function frequency response 400C of the circuit 400B is shown in FIG. 4C, which highlights the effect of the shunt inductor $L_{shunt}$ in boosting the high frequency components of the response. The transfer function frequency response 400C is shown for NRZ where $3G_{lsb}$=$G_v$. The high frequency boosting of the response leads to a boosted gain at Nyquist frequency and can open up the vertical eye, without resulting in extra power consumption and with a non-substantial chip area overhead, as the used shunt inductor $L_{shunt}$ is small (e.g., a few nano-Henry (nH)). In some implementations, the value of the shunt inductor $L_{shunt}$ and the $G_{shunt}$ can be programmable.

Figure 5:
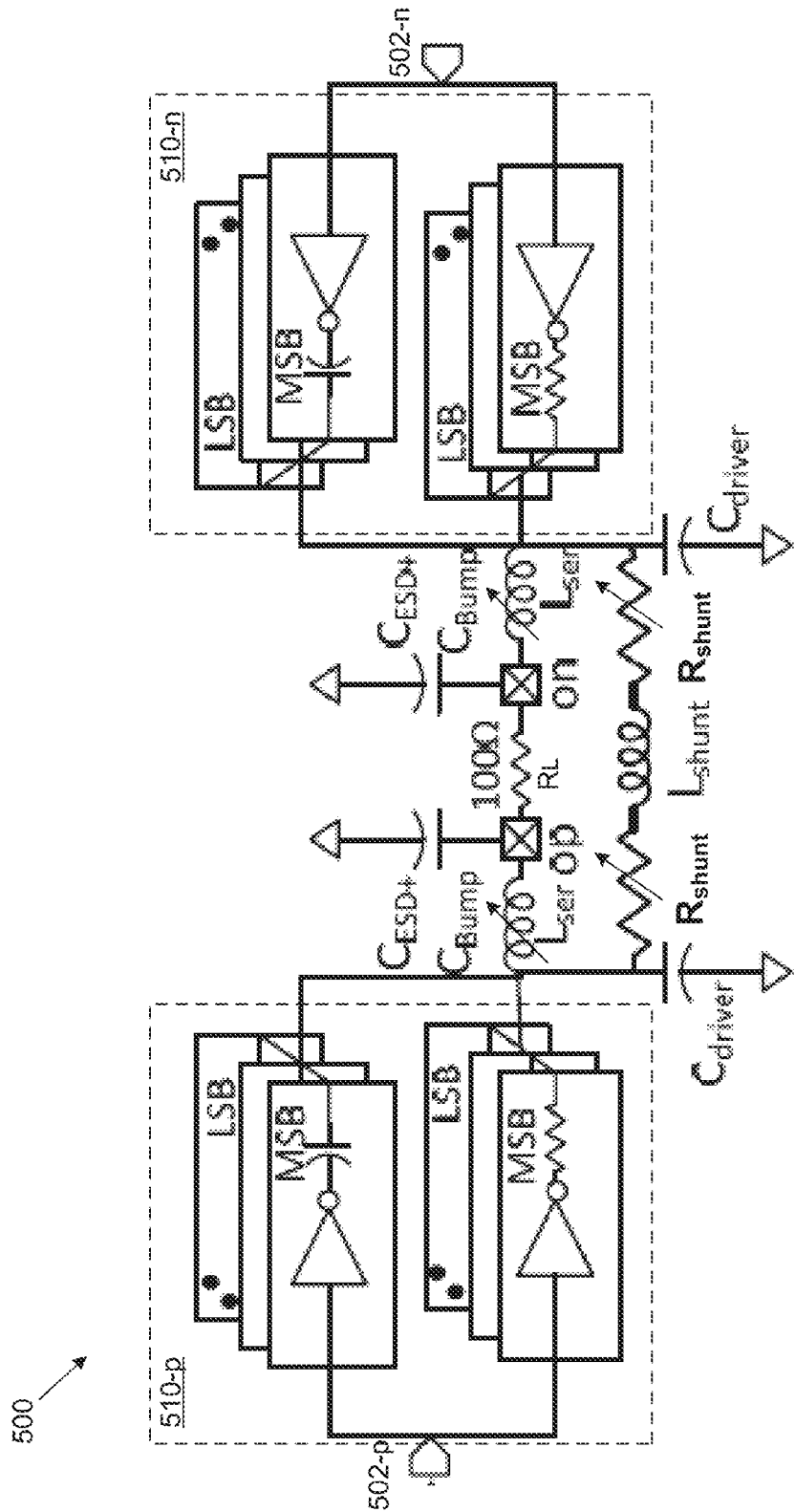
FIG. 5 illustrates an example implementation of a low-power reconfigurable voltage-mode DAC driver circuit with increased bandwidth and high-frequency loss compensation in accordance with one or more implementations.

FIG. 5 illustrates an example implementation of a low-power reconfigurable voltage-mode DAC driver circuit 500 with increased bandwidth and high-frequency loss compensation in accordance with one or more implementations of the subject technology. The DAC driver circuit 500 implements the bandwidth boosting schemes discussed with respect to FIGS. 3A through 3C and 4A through 4C with capacitive DACs included in DAC driver circuits 510-p and 510-n and using the shunt inductor $L_{shunt}$ in combination with the added shunt branch in parallel with the load. The other shown elements such as $C_{ESD}$, $C_{Bump}$, and $C_{driver}$ represent embedded elements or are common circuit elements, the discussion of which is out of the scope of the current disclosure. In some implementations, the values of $L_{ser}$ and $R_{shunt}$ can be programmable for amplitude configurability, and these elements can be leveraged for bandwidth extension. The differential DAC driver 500 is a DAC driver that receives inputs data at nodes 502-p and 502-n, for example, from a serializer circuit. The differential DAC is scalable with technology node and its features are even more advantageous in smaller technology nodes. The bandwidth extension techniques implemented in the differential DAC driver 500 allow for the DAC circuit to be scalable in frequency as well. Using the differential DAC driver 500 is expected to result in a drastic (e.g., 70%) reduction in power consumption.

Figures 6A, 6B:
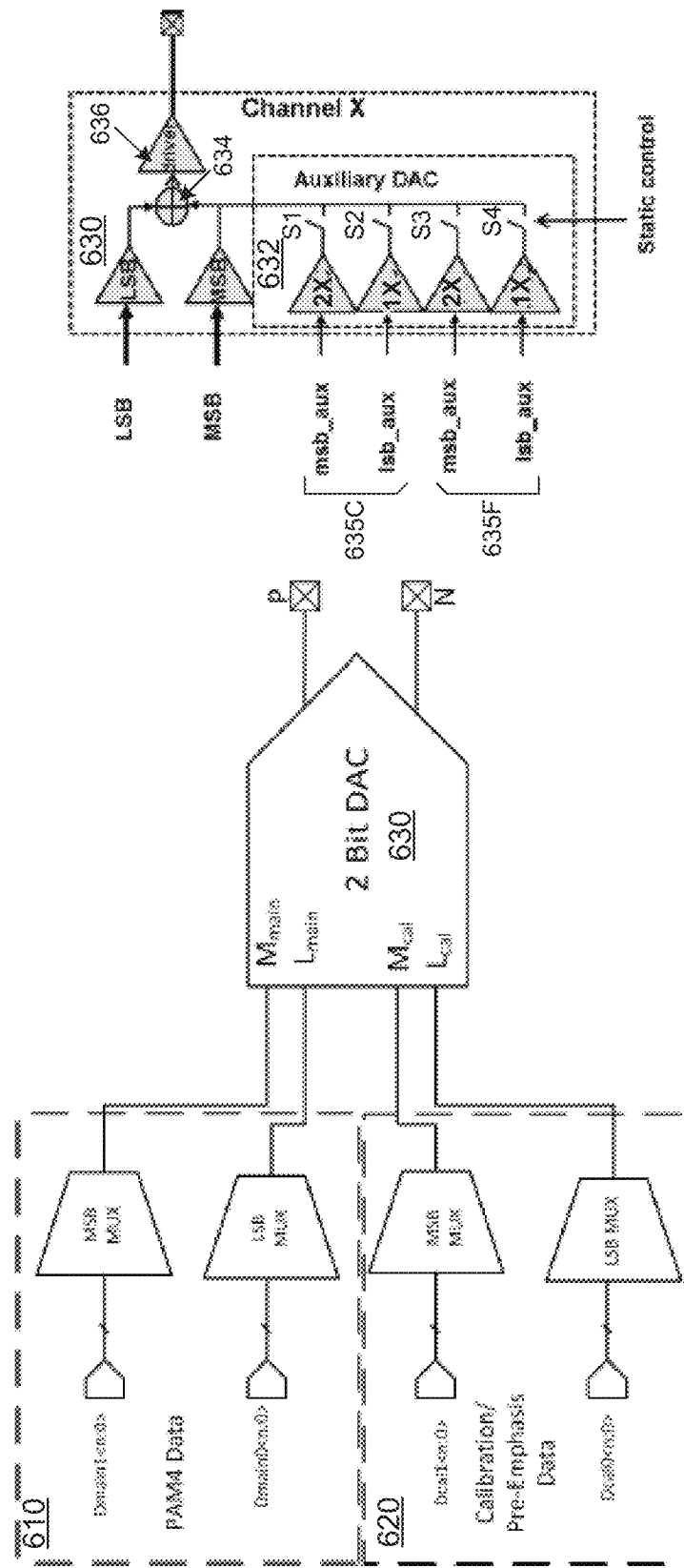

FIGS. 6A through 6E illustrate an example of a low-power reconfigurable voltage-mode DAC driver circuit 630 with an auxiliary DAC 632 in accordance with one or more implementations of the subject technology. The 2-bit DAC 630, shown in FIG. 6A, is similar to the core DAC driver circuit of, for example, FIG. 3C, in terms of receiving PAM-4 data (e.g., LSB and MSB main bits such as $M_{main}$ and $L_{main}$) from a PAM-4 input block 610. The 2-bit DAC 630, however, further receives calibration and/or pre-emphasis data (e.g., LSB and MSB calibration bits such as $M_{cal}$ and $L_{cal}$) from a calibration block 620. Each of the PAM-4 input block 610 and the calibration block 620 includes LSB and MSB multiplexers. In some aspects, the 2-bit DAC 630 is a differential circuit with P and N differential output nodes.

A 2-bit DAC 630, as shown in FIG, 6B, includes the core DAC including the LSB and MSB DAC units (e.g., similar to 200 of FIG. 2A), a driver circuit 636, and an auxiliary DAC 632. The A 2-bit DAC 630 has four output levels that can be individually controlled by any of the auxiliary inputs 635C and 635F, which are used for coarse and fine control of the output level, respectively. The coarse auxiliary inputs 635C are enabled by switches S1 and S2, and the fine auxiliary inputs 635F are enabled by the switches S3 and S4, which are controlled by a static control signal. The output of the auxiliary DAC 632 is combined by the outputs of the LSB and MSB DAC units of the 2-bit DAC 630 at the summation block 634. The application of the auxiliary DAC is not limited to a 2-bit DAC and can be implemented for DACs with higher number of bits (e.g., N bits). The Auxiliary DAC allows for 3 modes of operation of the DAC (e.g., 2-bit DAC 630) includes equalization both in PAM-4/N and NRZ applications, linearity calibration, and signal amplitude calibration, as described herein.

Figure 6C:
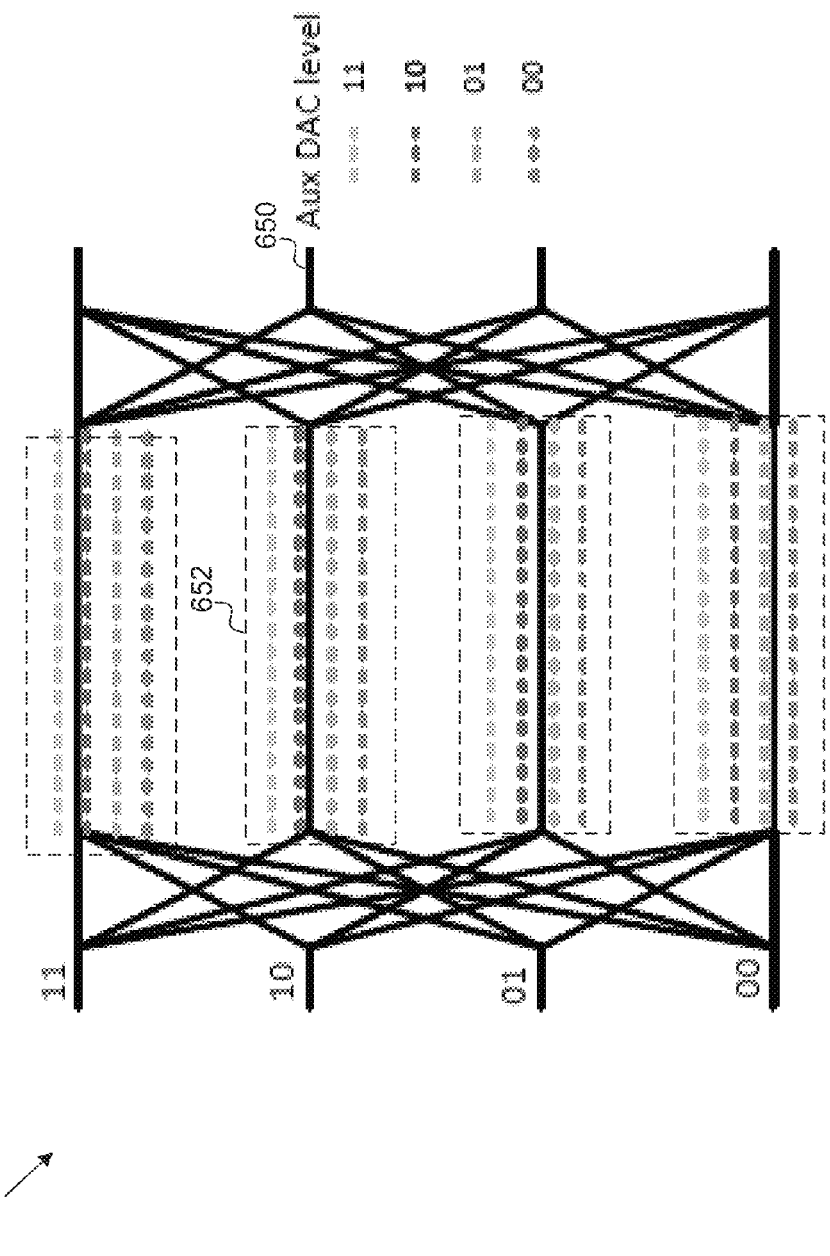

In a level diagram 600C, shown in FIG. 6C, four signal levels 650 of the main DAC (e.g., core levels) are depicted along with a respective 4-level auxiliary signals 652 (e.g., auxiliary levels) corresponding to the auxiliary DAC. The auxiliary levels can correct errors in core levels and allow for linearity correction or introduction in the core levels. For example, the auxiliary levels can be used to control linearity by introducing different corrections at different core levels, which can result in different eye diagram openings between the core levels.

The level diagrams 600D and 600E, shown in FIGS. 6D and 6E, indicate pre-emphasis mode and amplitude calibration mode of operation of the subject DAC driver leveraging an auxiliary DAC (e.g., 632 of FIG. 6B). The pre-emphasis is basically an equalization technique used to compensate for high frequency losses in a communication channel (e.g., a wireline). For example, the pre-emphasis mode of operation of the DAC as represented by the level diagrams 600D can boost the high-frequency components and reduce the level of the low-frequency components of the signal. The amplitude calibration mode of operation as depicted by the level diagram 600E allows changing amplitude of the signal by the four MSB and LSB auxiliary inputs of FIG. 6B. The auxiliary input data can change the core levels based on the incoming data received on the auxiliary inputs as shown in FIG. 6C.

Figure 7:
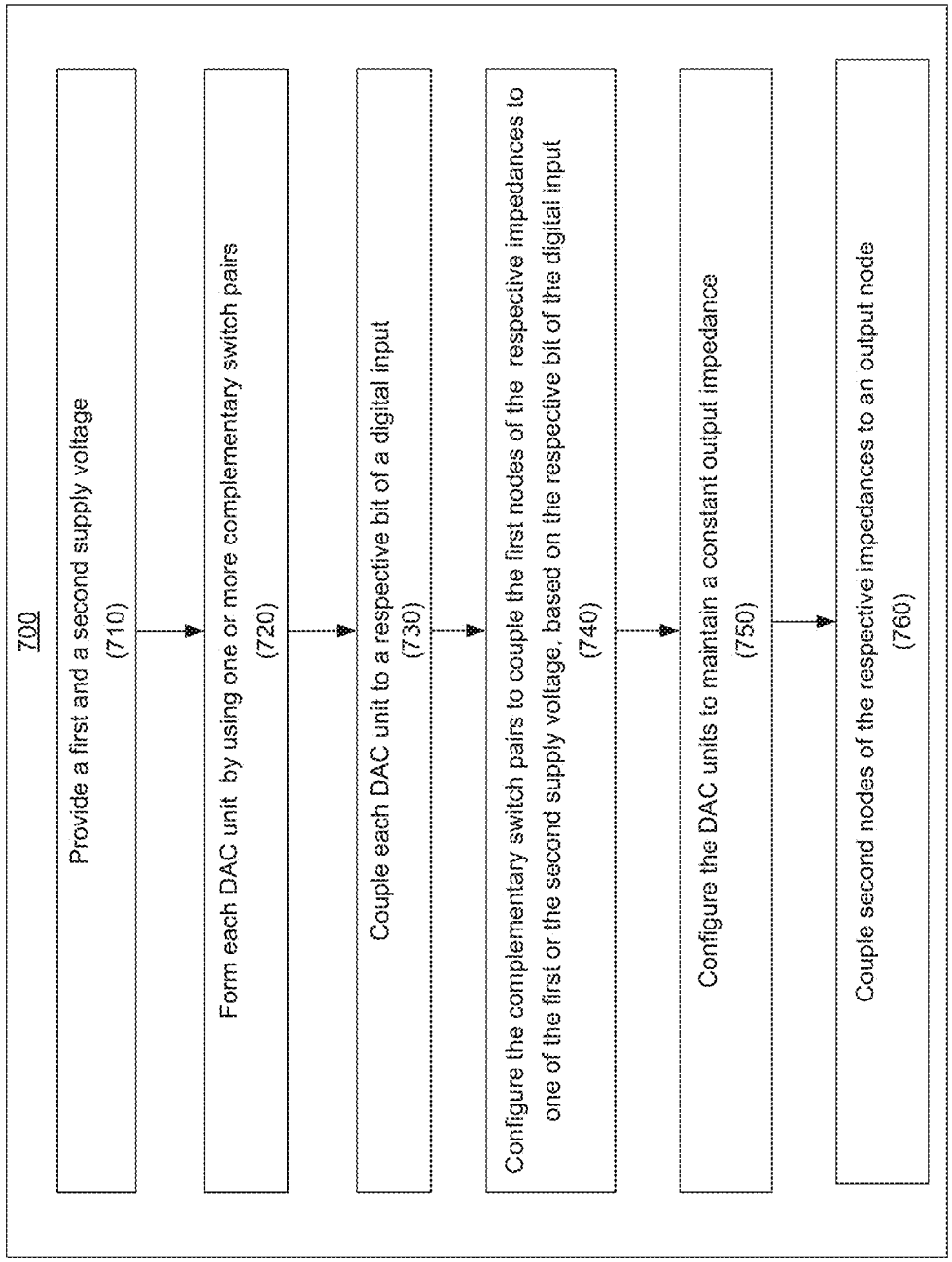
FIG. 7 illustrates an example of a method for providing a low-power reconfigurable voltage-mode DAC driver circuit in accordance with one or more implementations.

FIG. 7 illustrates an example of a method 700 for providing a low-power reconfigurable voltage-mode DAC driver circuit in accordance with one or more implementations of the subject technology. For explanatory purposes, the blocks of the example method 700 are described herein as occurring in serial, or linearly. However, multiple blocks of the example method 700 can occur in parallel. In addition, the blocks of the example method 700 need not be performed in the order shown and/or one or more of the blocks of the example method 700 need not be performed.

According to the method 700 a first and a second supply voltage (e.g., $V_{DD}$ and $V_{SS}$ of FIG. 1A) are provided (710). Each DAC unit (110-1 of FIG. 1A) of a plurality of DAC units is provided by using one or more complementary switch pairs (e.g., $S_{p1}$ and $S_{n1}$ of FIG. 1A or T1 and T2 of FIG. 2C) (720). Each DAC unit is coupled to a respective bit of a digital input (e.g., signals coupled to 102 and 104 of FIG. 1B) (730). The complementary switch pairs are configured to couple the first nodes (e.g., 244 of FIG. 2C) of the respective impedances (e.g., 246 of FIG. 2C) to one of the first or the second supply voltage, based on the respective bit of the digital input (coupled to 242 of FIG. 2C) (740). The DAC units are configured to maintain a constant output impedance (e.g., matching a load 112 of FIG. 1B or $R_L$ of FIG. 2D) (750). Each DAC unit is coupled to a respective bit of a digital input (e.g., coupled to 502-$p$ or 502-$n$ of FIG. 5) (760)

Figure 8:
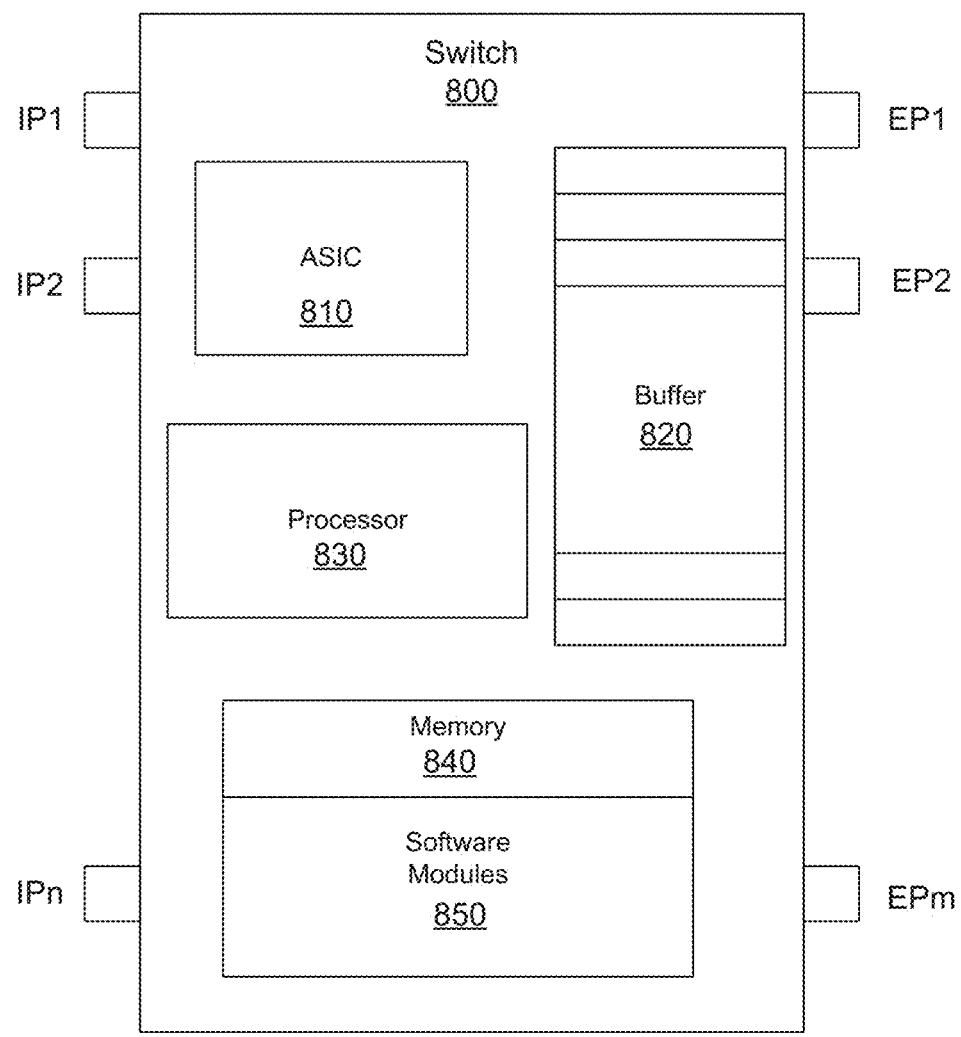
FIG. 8 illustrates an example of a communication device employing features of the subject technology in accordance with one or more implementations.

FIG. 8 illustrates an example of a communication device 800 employing features of the subject technology in accordance with one or more implementations of the subject technology. Examples of the communication device 800 includes an Ethernet switch/router of an Ethernet network such as a private network including a data-center network, an enterprise network, or other private networks. The communication device 800 includes a number of ingress (input) ports IP1-IPn and multiple egress (output) ports EP1-EPm. In one or more implementations, one or more of the ingress ports IP1-IPn can receive a data packet from another switch or and endpoint device of the network. The communication device 800 further includes a hardware component such as an application specific integrated circuit (ASIC) 810 (which in some embodiments can be implemented as a field-programmable logic array (FPGA)), a buffer 820, a processor 830, memory 840, and a software module 850.

In some implementations, the ASIC 810 can include suitable logic, circuitry, interfaces and/or code that can be operable to perform functionalities of a PHY circuit. The buffer 820 includes suitable logic, circuitry, code and/or interfaces that are operable to receive and store and/or delay a block of data for communication through one or more of the egress ports EP1-EPm. In one or more implementations, the ASIC 810 can include an integrated circuit that is coupled to the processor 830 and first and second supply voltages (e.g., $V_{DD}$ and $V_{SS}$, not shown in FIG. 8 for simplicity). The integrated circuit can include the low-power reconfigurable voltage-mode DAC driver circuit (e.g., 500 of FIG. 5) of the subject technology, to benefit from the advantageous features of the DAC driver circuit as discussed above.

The processor 830 includes suitable logic, circuitry, and/or code that can enable processing data and/or controlling operations of the communication device 800. In this regard, the processor 830 can be enabled to provide control signals to various other portions of the communication device 800. The processor 830 also controls transfers of data between various portions of the communication device 800. Additionally, the processor 830 can enable implementation of an operating system or otherwise execute code to manage operations of the communication device 800.

The memory 840 includes suitable logic, circuitry, and/or code that can enable storage of various types of information such as received data, generated data, code, and/or configuration information. The memory 840 includes, for example, RAM, ROM, flash, and/or magnetic storage. In various embodiment of the subject technology, the memory 840 may include a RAM, DRAM, SRAM, T-RAM, Z-RAM, TTRAM, or any other storage media. The memory 840 can include software modules 850 that when executed by a processor (e.g., processor 830) can perform some or all of the functionalities of the ASIC 810. In some implementations, the software modules 850 include codes that when executed by a processor can perform functionalities such as configuration of the communication device 800.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A low-power reconfigurable voltage-mode digital-to-analog converter (DAC) driver circuit, the circuit comprising:
   a first and a second supply voltage; and
   a plurality of DAC units, each DAC unit of the plurality of DAC units directly coupled to a respective bit of a digital input,
   wherein:
   the plurality of DAC units are configured to maintain a constant value for an output impedance of the DAC driver circuit,
   each DAC unit of the plurality of DAC units comprises a plurality of parallel coupled DAC slices,
   each DAC slice of the plurality of parallel coupled DAC slices comprises a complementary switch pair of one or more complementary switch pairs and a respective impedance of one or more respective impedances,
   the one or more complementary switch pairs are configured to couple first nodes of the plurality of parallel coupled DAC slices to one of the first or the second supply voltage, based on the respective bit of the digital input, and
   second nodes of the plurality of parallel coupled DAC slices are coupled to an output node.

2. The circuit of claim 1, wherein the output node is coupled to a load, wherein the constant value for the output impedance matches an impedance of the load, and wherein one or more respective impedances comprise one or more resistor elements.

3. The circuit of claim 1, wherein the digital input comprises N bits, wherein a count of the plurality of DAC slices of a DAC unit of the plurality of DAC units that are coupled to a least significant bit (LSB) of the digital input is equal to n, wherein N and n are positive integers.

4. The circuit of claim 3, wherein the plurality of DAC units are coupled to one or more shunt circuits to achieve amplitude configurability while maintaining constant impedance, and wherein the shunt circuits are programmable.

5. The circuit of claim 3, wherein each of the one or more complementary switch pairs comprises a CMOS inverter, wherein the second supply voltage comprises ground potential, wherein an output voltage of the circuit is a linear function of the digital input, and wherein the circuit is implemented in a differential configuration.

6. The circuit of claim 3, wherein a count of the plurality of DAC slices of a DAC unit of the plurality of DAC units that are coupled to an Nth significant bit of the digital input is equal to $(2^{N-1})n$, and wherein n is programmable.

7. The circuit of claim 1, further comprising equalization capacitors configured to extend a bandwidth of the circuit, wherein the equalization capacitors are implemented in a plurality of capacitive DAC units, wherein the equalization capacitors are embedded in the plurality of DAC units, and wherein the equalization capacitors are programmable.

8. The circuit of claim 7, further comprising shunt inductors configured to frequency boost an amplitude of an output voltage of the circuit, wherein the shunt inductors are programmable.

9. The circuit of claim 1, further comprising an auxiliary DAC configured to receive at least one of calibration or pre-emphasis data, wherein the auxiliary DAC is configured to enable three modes of operations including equalization, linearity calibration, and amplitude calibration, and wherein the three modes of operation are programmable.

10. A method of providing a low-power reconfigurable voltage-mode digital-to-analog converter (DAC) driver circuit, the method comprising:
 providing a first and a second supply voltage;
 forming each DAC unit of a plurality of DAC units comprises forming a plurality of parallel coupled DAC slices by forming each DAC slice of the plurality of parallel coupled DAC slices using a complementary switch pair of one or more complementary switch pairs and a respective impedance of one or more respective impedances;
 directly coupling each DAC unit of the plurality of DAC units to a respective bit of a digital input;
 configuring the one or more complementary switch pairs to couple first nodes of the plurality of parallel coupled DAC slices to one of the first or the second supply voltage, based on the respective bit of the digital input;
 configuring the plurality of DAC units to maintain a constant value for an output impedance of the DAC driver circuit; and
 coupling second nodes of the plurality of parallel coupled DAC slices to an output node.

11. The method of claim 10, further comprising coupling the output node to a load, wherein the constant value for the output impedance matches an impedance of the load, and wherein the one or more respective impedances comprise one or more resistor elements.

12. The method of claim 10, wherein the digital input comprises N bits, wherein forming a DAC unit of the plurality of DAC units comprises coupling n DAC slice of the plurality of DAC slices to a least significant bit (LSB) of the digital input, wherein N and n are positive integers, and wherein a count of the plurality of DAC slices of a DAC unit of the plurality of DAC units that are coupled to an Nth significant bit of the digital input is equal to $(2^N-1)n$, and wherein n is programmable.

13. The method of claim 12, further comprising coupling the plurality of DAC units to one or more shunt circuits to achieve amplitude configurability while maintaining constant impedance, wherein the shunt circuits are programmable.

14. The method of claim 12, wherein configuring the one or more complementary switch pairs comprises forming each of the one or more complementary switch pairs by using a CMOS inverter, wherein the second supply voltage comprises ground potential, wherein the method further comprises configuring the DAC driver circuit to provide an output voltage that is a linear function of the digital input, and wherein the method further comprises implementing the DAC driver circuit in a differential configuration.

15. The method of claim 10, further comprising implementing equalization and configuring the equalization capacitors to extend a bandwidth of the DAC driver circuit, wherein implementing the equalization capacitors comprises embedding the equalization capacitors in a plurality of DAC units, and wherein the equalization capacitors are programmable.

16. The method of claim 15, further comprising implementing shunt inductors and configuring the shunt inductors to frequency boost an amplitude of an output voltage of the circuit, wherein the shunt inductors are programmable and scalable with a number of bits of the digital input.

17. The method of claim 10, further comprising:
 providing an auxiliary DAC; and
 configuring the auxiliary DAC to receive at least one of calibration or pre-emphasis data.

18. The method of claim 17, further comprising configuring the auxiliary DAC to enable one of three modes of operations including equalization, linearity calibration, and amplitude calibration, wherein the three modes of operation are programmable.

19. A communication device comprising:
 a processor;
 a first and a second supply voltage; and
 an integrated circuit coupled to the processor and the first and the second supply voltages and comprising:
  a low-power reconfigurable voltage-mode digital-to-analog converter (DAC) driver circuit comprising a plurality of DAC units configured to maintain a constant value of an output impedance of the DAC driver circuit, wherein each DAC unit of the plurality of DAC units is directly coupled to a respective bit of a digital input, and wherein each DAC unit of the plurality of DAC units comprises a plurality of parallel coupled DAC slices, each DAC slice of the plurality of parallel coupled DAC slices comprises a complementary switch pair of one or more complementary switch pairs and a respective impedance of one or more respective impedances, the one or more complementary switch pairs are configured to couple first nodes of the plurality of parallel coupled DAC slices to one of the first or the second supply voltage, based on the respective bit of the digital input.

20. The communication device of claim 19, wherein:
 second nodes of the one or more respective impedances are coupled to an output node, the output node is coupled to a load, and
 the constant value for the output impedance matches an impedance of the load, and wherein the one or more respective impedances comprise one or more resistor elements.

* * * * *